US012761303B2

(12) United States Patent
Yang et al.

(10) Patent No.: US 12,761,303 B2
(45) Date of Patent: Oct. 13, 2026

(54) IMAGING METHOD AND DEVICE USING A MOBILE MAGNETIC RESONANCE APPARATUS, STORAGE MEDIUM, AND TERMINAL

(71) Applicant: Beijing Chao-Yang Hospital, Capital Medical University, Beijing (CN)

(72) Inventors: Qi Yang, Beijing (CN); Yueyan Bian, Beijing (CN); Xiuqin Jia, Beijing (CN); Xiaoxu Yang, Beijing (CN)

(73) Assignee: BEIJING CHAO-YANG HOSPITAL, CAPITAL MEDICAL UNIVERSITY, Beijing (CN)

( * ) Notice: Subject to any disclaimer, the term of this patent is extended or adjusted under 35 U.S.C. 154(b) by 372 days.

(21) Appl. No.: 18/443,443

(22) Filed: Feb. 16, 2024

(65) Prior Publication Data

US 2024/0280659 A1 Aug. 22, 2024

(30) Foreign Application Priority Data

Feb. 22, 2023 (CN) ......................... 202310151513.1

(51) Int. Cl.
*G01R 33/56* (2006.01)
*G01R 33/00* (2006.01)
*G01R 33/48* (2006.01)

(52) U.S. Cl.
CPC ..... *G01R 33/5608* (2013.01); *G01R 33/0047* (2013.01); *G01R 33/4818* (2013.01)

(58) Field of Classification Search
CPC ............ G01R 33/0047; G01R 33/4818; G01R 33/5608
See application file for complete search history.

(56) References Cited

U.S. PATENT DOCUMENTS

2019/0195975 A1* 6/2019 Liu ...................... G01R 33/561
2020/0058106 A1* 2/2020 Lazarus ............ G01R 33/5608
2020/0271743 A1* 8/2020 Takeshima ............ G06N 3/045

FOREIGN PATENT DOCUMENTS

CN 106597333 A 4/2017
CN 109350061 A 2/2019
(Continued)

OTHER PUBLICATIONS

First Office Action dated Mar. 30, 2023 received in Chinese Patent Application No. 202310151513.1.

*Primary Examiner* — Gregory H Curran
(74) *Attorney, Agent, or Firm* — Scully, Scott, Murphy & Presser, P.C.

(57) ABSTRACT

The present disclosure provides an imaging method using a mobile magnetic resonance apparatus, which includes: randomly sampling an object-to-be-scanned using a mobile magnetic resonance apparatus to acquire encoding of the frequency and phase of the tissue of the object-to-be-scanned, and obtain target K-space data; inputting the target K-space data and pre-generated denoising reconstruction network parameters into a pre-trained denoising reconstruction network; where the pre-trained denoising reconstruction network is generated by training based on fully sampled training data; and outputting a magnetic resonance image corresponding to the object-to-be-scanned. The fully sampled training data is constructed by increasing the scanning time in the present application, the pre-trained denoising reconstruction network is obtained through model training based on the training data, real-time data is obtained through random sampling in a short period of time in practical applications, and high-quality images are output in combination with the pre-trained denoising reconstruction network.

8 Claims, 3 Drawing Sheets

(56) References Cited

FOREIGN PATENT DOCUMENTS

| | | | |
|---|---|---|---|
| CN | 109884625 | A | 6/2019 |
| CN | 113781461 | A | 12/2021 |
| CN | 114010180 | A | 2/2022 |
| CN | 115375785 | A | 11/2022 |

* cited by examiner

IMAGING METHOD AND DEVICE USING A MOBILE MAGNETIC RESONANCE APPARATUS, STORAGE MEDIUM, AND TERMINAL

TECHNICAL FIELD

The present disclosure relates to the technical field of image processing and the technical field of digital medical treatment, and in particular to an imaging method using a mobile magnetic resonance apparatus, an imaging device using a mobile magnetic resonance apparatus, a storage medium, and a terminal.

BACKGROUND

Dut to its characteristics of small volume, light weight, and no need for a magnetic resonance shielding room installed at a fixed site, a mobile magnetic resonance apparatus is used for magnetic resonance imaging examination of some special patients, such as emergency patients, intensive care patients, etc., who are not convenient for long-distance movement and have strict requirements for examination time. However, due to the generally lower magnetic resonance field strength of the mobile magnetic resonance apparatus compared to a fixed magnetic resonance apparatus, the imaging quality of the mobile magnetic resonance apparatus is inferior to that of the fixed magnetic resonance apparatus.

At present, in order to overcome the defect of poor imaging quality of the mobile magnetic resonance apparatus, the scanning time is increased to ensure the imaging quality of portable mobile magnetic resonance. However, increasing the scanning time is unacceptable for patients with extremely strict requirements for examination time, such as those with acute ischemic cerebral stroke.

In summary, how the mobile magnetic resonance apparatus can generate high-quality magnetic resonance images in a short period of time is an urgent problem that needs to be solved.

SUMMARY

Embodiments of the present application provide an imaging method using a mobile magnetic resonance apparatus, an imaging device using a mobile magnetic resonance apparatus, a storage medium, and a terminal. In order to enable a basic understanding of some aspects of the disclosed embodiments, a brief summary is provided below. This summary is not a general description, nor is it intended to identify key/important constituent elements or describe the scope of protection of these embodiments. Its sole purpose is to present some concepts in a simple form as the preamble to the detailed description that follows.

In a first aspect, an embodiment of the present application provides an imaging method using a mobile magnetic resonance apparatus, which includes:

randomly sampling an object-to-be-scanned using a mobile magnetic resonance apparatus to acquire encoding of the frequency and phase of the tissue of the object-to-be-scanned, and obtain target K-space data;

inputting the target K-space data and pre-generated denoising reconstruction network parameters into a pre-trained denoising reconstruction network; where the pre-trained denoising reconstruction network is generated by training based on fully sampled training data; and outputting a magnetic resonance image corresponding to the object-to-be-scanned.

Optionally, the pre-trained denoising reconstruction network is generated according to the following steps, which include:

using the mobile magnetic resonance apparatus to perform full sampling on multiple scanning objects to acquire the encoding of the frequency and phase of the tissue of each scanning object, and obtain multiple pieces of K-space training data;

constructing fully sampled training data based on the multiple pieces of K-space training data;

constructing a target denoising reconstruction network, inputting the fully sampled training data into the target denoising reconstruction network, and outputting a network cost value; and generating a pre-trained denoising reconstruction network and pre-generated denoising reconstruction network parameters when the network cost value reaches its minimum.

Optionally, the constructing fully sampled training data based on the multiple pieces of K-space training data includes:

performing image reconstruction based on each K-space data to obtain the magnetic resonance image of each K-space data;

associating each K-space data with its corresponding magnetic resonance image to obtain a K-space image dataset; and randomly dividing the K-space image dataset into equal parts, and determining a preset number of parts of the K-space image dataset as the fully sampled training data.

Optionally, the constructing a target denoising reconstruction network includes: constructing a denoising reconstruction network using neural networks;

constructing a cost function of the denoising reconstruction network; and mapping the cost function to the denoising reconstruction network to obtain a target denoising reconstruction network;

where the cost function is:

$$F(x) = \min_{x,D,\{\gamma_i\}} \sum_i \left( (\|R_i x - D\gamma_i\|) + \alpha\|Y - FFTx\|_2^2 + \beta\|R_i x - FFTx\|_2^2 ; \right.$$

where $R_i$ is a feature coefficient vector, x is a feature vector, D is the fully sampled training data, $\gamma_i$ is the parameter of the denoising reconstruction network, FFT is the discrete Fourier transform, Y is a true value of the reconstructed image, and $\alpha$ and $\beta$ are constants.

Optionally, before the randomly sampling an object-to-be-scanned using a mobile magnetic resonance apparatus, the method further includes:

using a random sampling function to construct a random sampling block of a preset size to obtain a data random collection layer; and setting data collection parameters of the mobile magnetic resonance apparatus as the data random collection layer.

Optionally, the function of the random sampling block is:

$$K_S(i, j) = \begin{cases} Rand_S(i, j) \geq 0.5 \\ Rand_S(i, j) < 0.5 \end{cases}, 0 \leq i \leq S, 0 \leq j \leq S;$$

where $K_s$ is the random sampling block, i, j are element coordinates of the random sampling block, S is the size of the random sampling block, and $Rand_s$ is the random sampling function.

Optionally, the generating a pre-trained denoising reconstruction network and pre-generated denoising reconstruction network parameters when the network cost value reaches its minimum includes:

when the network cost value does not reach its minimum, backpropagating the network cost value to update the network parameters of the denoising reconstruction network, and continuing the execution of the step of "inputting the fully sampled training data into the target denoising reconstruction network and outputting a network cost value" until the network cost value reaches its minimum and the number of network training reaches a preset number to generate the pre-trained denoising reconstruction network and pre-generated denoising reconstruction network parameters.

In a second aspect, an embodiment of the present application provides an imaging device using a mobile magnetic resonance apparatus, which includes:

a target K-space data generation module, which is configured to randomly sample an object-to-be-scanned using a mobile magnetic resonance apparatus to acquire encoding of the frequency and phase of the tissue of the object-to-be-scanned, and obtain target K-space data;

a data input module, which is configured to input the target K-space data and pre-generated denoising reconstruction network parameters into a pre-trained denoising reconstruction network; where the pre-trained denoising reconstruction network is generated based on fully sampled training data; and a magnetic resonance image output module, which is configured to output a magnetic resonance image corresponding to the object-to-be-scanned.

In a third aspect, an embodiment of the present application provides a computer storage medium, on which multiple instructions suitable for being loaded by a processor to execute the above method steps are stored.

In a fourth aspect, an embodiment of the present application provides a terminal, which may include a processor and a memory; where computer programs are stored in the memory, and the computer programs are suitable for being loaded by the processor to execute the above method steps.

The technical solutions provided in the embodiments of the present application may have the following advantageous effects.

In the embodiments of the present application, the imaging device using the mobile magnetic resonance apparatus first randomly samples the object-to-be-scanned through the mobile magnetic resonance apparatus to acquire the encoding of the frequency and phase of the tissue of the object-to-be-scanned, and obtain the target K-space data. Then, the target K-space data and the pre-generated denoising reconstruction network parameters are input into the pre-trained denoising reconstruction network; the pre-trained denoising reconstruction network is generated by training based on fully sampled training data, and finally the magnetic resonance image corresponding to the object-to-be-scanned is output. The fully sampled training data is constructed by increasing the scanning time in the present application, the pre-trained denoising reconstruction network is obtained through model training based on the training data, real-time data is obtained through random sampling in a short period of time in practical applications, and high-quality images are output in combination with the pre-trained denoising reconstruction network; therefore, the mobile magnetic resonance apparatus can generate the magnetic resonance images in a short period of time, and the speed of generating high-quality magnetic resonance images is increased.

It should be understood that the above general description and the following detailed description are only illustrative and explanatory, and cannot limit the present disclosure.

BRIEF DESCRIPTION OF THE DRAWINGS

The accompanying drawings are herein incorporated into the specification and form a part of this specification; they illustrate embodiments in accordance with the present disclosure and are used together with the specification to explain the principles of the present disclosure.

DETAILED DESCRIPTION

Figure 1:
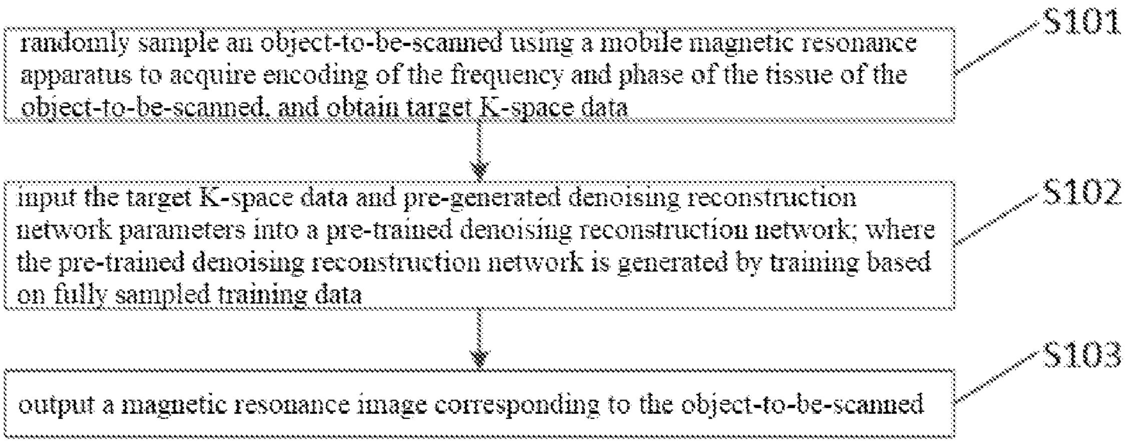
FIG. 1 is a schematic flowchart of an imaging method using a mobile magnetic resonance apparatus provided by an embodiment of the present application.

The following description and drawings fully illustrate the specific embodiments of the present disclosure to enable those skilled in the art to carry them out.

It should be noted that the described embodiments are only some of the embodiments of the present disclosure, not all of them. Based on the embodiments in the present disclosure, all the other embodiments obtained by those skilled in the art without creative effort will fall within the scope of protection of the present disclosure.

When the drawings are referred to in the following description, unless otherwise indicated, the same numbers in different drawings denote the same or similar elements. The implementations described in the following exemplary embodiments do not represent all implementations consistent with the present disclosure. On the contrary, they are only examples of the device and method that are consistent with some aspects of the present disclosure as detailed in the appended claims.

In the description of the present disclosure, it should be understood that terms "first", "second" and the like are only used for descriptive purpose and should not be understood as indicating or implying relative importance. For those skilled in the art, the specific meanings of the above terms in the present disclosure can be understood according to specific situations. Further, in the description of the present disclosure, unless otherwise specified, "multiple" refers to two or more. "and/of" describes the association relationship of the associated objects, indicating that there can be three types of relationships. For example, A and/or B can represent the following three situations: the existence of A alone, the coexistence of A and B, and the existence of B alone. The character "/" generally indicates that the associated objects in front of and behind "/" have an "or" relationship.

The present application provides an imaging method using a mobile magnetic resonance apparatus, an imaging device using a mobile magnetic resonance apparatus, a storage medium and a terminal to solve the problems existing in the above related art. In the technical solutions provided in the present application, the fully sampled training data is constructed by increasing the scanning time in the present application, the pre-trained denoising reconstruction network is obtained through model training based on the training data, real-time data is obtained through random sampling in a short period of time in practical applications, and high-quality images are output in combination with the pre-trained denoising reconstruction network; therefore, the mobile magnetic resonance apparatus can generate the magnetic resonance images in a short period of time, and the speed of generating high-quality magnetic resonance images is increased. Exemplary embodiments will be used below for detailed description.

In the following, the imaging method using a mobile magnetic resonance apparatus provided by an embodiment of the present application will be described in detail with reference to FIGS. 1 to 3. This method can be implemented through computer programs, or can be executed on an imaging device using a mobile magnetic resonance apparatus and based on the von Neumann system. The computer programs can be integrated into an application, or run as an independent tool application.

Reference is made to FIG. 1, which is a schematic flowchart of the imaging method using a mobile magnetic resonance apparatus provided by an embodiment of the present application. As shown in FIG. 1, the method of the embodiment of the present application may include the following steps S101 to S103.

S101: randomly sampling an object-to-be-scanned using a mobile magnetic resonance apparatus to acquire encoding of the frequency and phase of the tissue of the object-to-be-scanned, and obtain target K-space data;

where the mobile magnetic resonance apparatus may be a portable magnetic resonance imaging apparatus having a small volume and light weight. The mobile magnetic resonance apparatuses mostly have a field strength below 1T, resulting in poor image quality of the image generated in a short period of time. The fixed magnetic resonance apparatuses can generate high-quality images in a short period of time due to its field strength ranging from 1T to 3T. The object-to-be-scanned can be a target user that needs to be imaged using the mobile magnetic resonance apparatus. Random sampling is carried out based on sampling parameters pre-set in the mobile magnetic resonance apparatus. The randomly sampled data requires a shorter time, ensuring that encoding data characterizing the object-to-be-scanned can be acquired in a short period of time.

In the embodiment of the present application, before randomly sampling the object-to-be-scanned using the mobile magnetic resonance apparatus, a data random collection layer also needs to be set for the mobile magnetic resonance apparatus. First, a random sampling function is used to construct a random sampling block of a preset size to obtain a data random collection layer, and then data collection parameters of the mobile magnetic resonance apparatus are set as the data random collection layer. The random sampling function can be represented as Rands, where the best implementation of the random sampling function Rands is a pseudo-random algorithm, but is not limited to this algorithm. The construction of the random sampling block of size S can be represented as Ks, where the optimal value of S is 5, but is not limited to this value.

Specifically, the function of the random sampling block is:

$$K_S(i, j) = \begin{cases} Rand_S(i, j) \geq 0.5 \\ Rand_S(i, j) < 0.5 \end{cases}, \; 0 \leq i \leq S, \; 0 \leq j \leq S;$$

where $K_S$ is the random sampling block, i, j are element coordinates of the random sampling block, S is the size of the random sampling block, and $Rand_s$ is the random sampling function.

In a possible implementation, after setting the data random collection layer for the mobile magnetic resonance apparatus, the object-to-be-scanned can be randomly sampled by the mobile magnetic resonance apparatus to obtain the encoding of the frequency and phase of the tissue of the object-to-be-scanned, and obtain the target K-space data. The K-space data is frequency domain data, with low-frequency components being concentrated in the central region of K-space and high-frequency components being concentrated in the periphery of K-space.

S102: inputting the target K-space data and pre-generated denoising reconstruction network parameters into a pre-trained denoising reconstruction network; where the pre-trained denoising reconstruction network is generated by training based on fully sampled training data;

where the pre-generated denoising reconstruction network parameters and the pre-trained denoising reconstruction network are generated after training the network using the fully sampled data of multiple scanning objects.

In the embodiment of the present application, first, the mobile magnetic resonance apparatus is used to perform full sampling on multiple scanning objects to acquire the encoding of the frequency and phase of the tissue of each scanning object, and obtain multiple pieces of K-space training data; then, fully sampled training data is constructed based on the multiple pieces of K-space training data; next, a target denoising reconstruction network is constructed, the fully sampled training data is input into the target denoising reconstruction network, and a network cost value is output; and finally, when the network cost value reaches its minimum, a pre-trained denoising reconstruction network and pre-generated denoising reconstruction network parameters are generated. The pre-trained denoising reconstruction network and pre-generated denoising reconstruction network parameters can be integrated into the mobile magnetic resonance apparatus for use, or can be integrated into a third-party computer terminal for use.

In a possible implementation, if the pre-trained denoising reconstruction network and the pre-generated denoising reconstruction network parameters are integrated into the mobile magnetic resonance apparatus for use, then after the target K-space data is obtained, the target K-space data and the pre-generated denoising reconstruction network parameters can be directly input into the pre-trained denoising reconstruction network for processing.

In another possible implementation, if the pre-trained denoising reconstruction network and the pre-generated denoising reconstruction network parameters are integrated into the third-party computer terminal for use, then after the target K-space data is obtained, the data can be sent to the third-party computer terminal; after receiving the target K-space data, the third-party computer terminal can input the target K-space data and the pre-generated denoising reconstruction network parameters into the pre-trained denoising reconstruction network for processing.

Specifically, the pre-trained denoising reconstruction network can complete the target K-space data by interpolating based on the pre-generated denoising reconstruction network parameters to obtain sufficient encoding data. The pre-trained denoising reconstruction network can determine high-quality magnetic resonance images based on the sufficient encoding data.

S103: outputting a magnetic resonance image corresponding to the object-to-be-scanned.

In the embodiment of the present application, after the processing in the pre-trained denoising reconstruction network, the magnetic resonance image corresponding to the object-to-be-scanned can be output.

In the embodiments of the present application, the imaging device using the mobile magnetic resonance apparatus first randomly samples the object-to-be-scanned through the mobile magnetic resonance apparatus to acquire the encoding of the frequency and phase of the tissue of the object-to-be-scanned, and obtain the target K-space data. Then, the target K-space data and the pre-generated denoising reconstruction network parameters are input into the pre-trained denoising reconstruction network; the pre-trained denoising reconstruction network is generated by training based on fully sampled training data, and finally the magnetic resonance image corresponding to the object-to-be-scanned is output. The fully sampled training data is constructed by increasing the scanning time in the present application, the pre-trained denoising reconstruction network is obtained through model training based on the training data, real-time data is obtained through random sampling in a short period of time in practical applications, and high-quality images are output in combination with the pre-trained denoising reconstruction network; therefore, the mobile magnetic resonance apparatus can generate the magnetic resonance images in a short period of time, and the speed of generating high-quality magnetic resonance images is increased.

Figure 2:
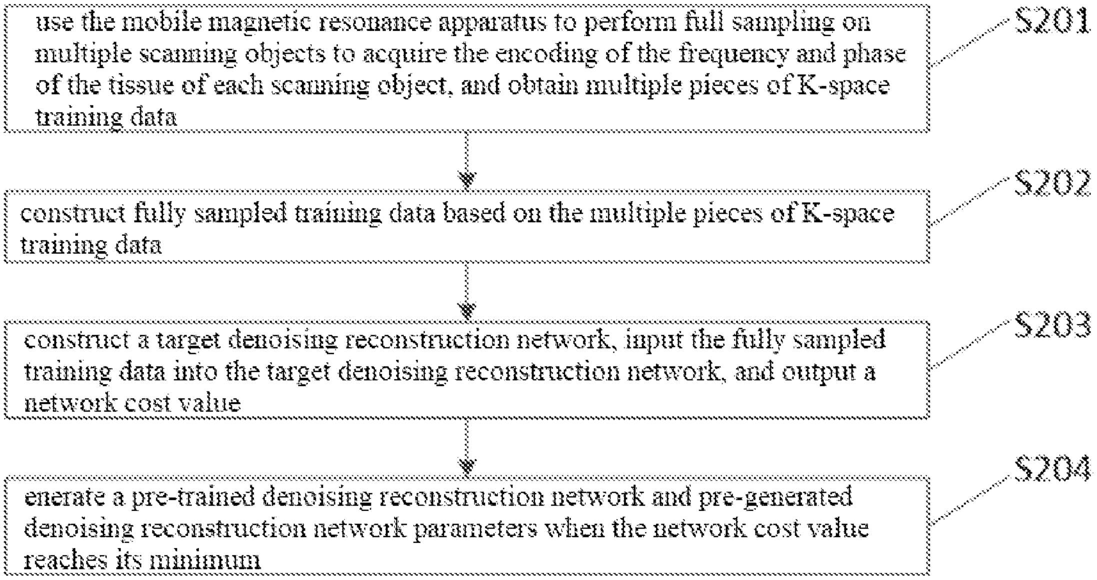
FIG. 2 is a schematic flowchart of a denoising reconstruction network training method provided by an embodiment of the present application.

Reference is made to FIG. 2, which is a schematic flowchart of a denoising reconstruction network training method provided by an embodiment of the present application. As shown in FIG. 2, the method of the embodiment of the present application may include the following steps S201 to S204.

S201: using the mobile magnetic resonance apparatus to perform full sampling on multiple scanning objects to acquire the encoding of the frequency and phase of the tissue of each scanning object, and obtain multiple pieces of K-space training data;

in a possible implementation, the mobile magnetic resonance apparatus is used to perform full sampling on multiple scanning objects to acquire the encoding of the frequency and phase of the tissue of each scanning object, and obtain multiple pieces of K-space training data DK, where the optimal value of n is 100, but is not limited to this value.

S202: constructing fully sampled training data based on the multiple pieces of K-space training data;

in the embodiment of the present application, when constructing the fully sampled training data based on the multiple pieces of K-space training data, first, image reconstruction is performed based on each K-space data to obtain the magnetic resonance image of each K-space data; then, each K-space data is associated with its corresponding magnetic resonance image to obtain a K-space image dataset; finally, the K-space image dataset is randomly divided into equal parts, and a preset number of parts of the K-space image dataset is determined as the fully sampled training data.

In a possible implementation, the multiple pieces of K-space training data DK is reconstructed to obtain an image dataset DI; the multiple pieces of K-space training data DK is made correspond with the image dataset DI one on one based on the reconstruction relationship to construct a K-space image dataset D; the K-space image dataset D is randomly divided into five equal parts, with each part separately serving as a test set and the remaining four parts serving as the fully sampled training data.

S203: constructing a target denoising reconstruction network, inputting the fully sampled training data into the target denoising reconstruction network, and outputting a network cost value;

in the embodiment of the present application, when constructing the target denoising reconstruction network, the neural networks are first used to construct a denoising reconstruction network, then a cost function of the denoising reconstruction network is constructed, and finally the cost function is mapped to the denoising reconstruction network to obtain a target denoising reconstruction network.

where the cost function is:

$$F(x) = \min_{x,D,\{\gamma_i\}} \sum_i \left((\|R_i x - D\gamma_i\|) + \alpha\|Y - FFTx\|_2^2 + \beta\|R_i x - FFTx\|_2^2;\right.$$

where $R_i$ is a feature coefficient vector, x is a feature vector, D is the fully sampled training data $\gamma_i$, is the parameter of the denoising reconstruction network, FFT is the discrete Fourier transform, Y is a true value of the reconstructed image, and α and β are constants.

In the embodiment of the present application, after the target denoising reconstruction network is obtained, the fully sampled training data can be input into the target denoising reconstruction network to output the network cost value.

In a possible implementation, the target denoising reconstruction network N is constructed using neural networks such as UNet, ResNet, etc. The fully sampled training data is input into the target denoising reconstruction network N, and the network cost value is output.

S204: generating a pre-trained denoising reconstruction network and pre-generated denoising reconstruction network parameters when the network cost value reaches its minimum.

In a possible implementation, when the network cost value reaches its minimum, a pre-trained denoising reconstruction network $N_t$ and pre-generated denoising reconstruction network parameters $\gamma_t$ are generated.

In another possible implementation, when the network cost value does not reach its minimum, the network cost value is backpropagated to update the network parameters of the denoising reconstruction network, and the execution of the step of "inputting the fully sampled training data into the target denoising reconstruction network and outputting a network cost value" is continued until the network cost value reaches its minimum and the number of network training reaches a preset number to generate the pre-trained denoising reconstruction network $N_t$ and pre-generated denoising reconstruction network parameters $\gamma_t$.

Figure 3:
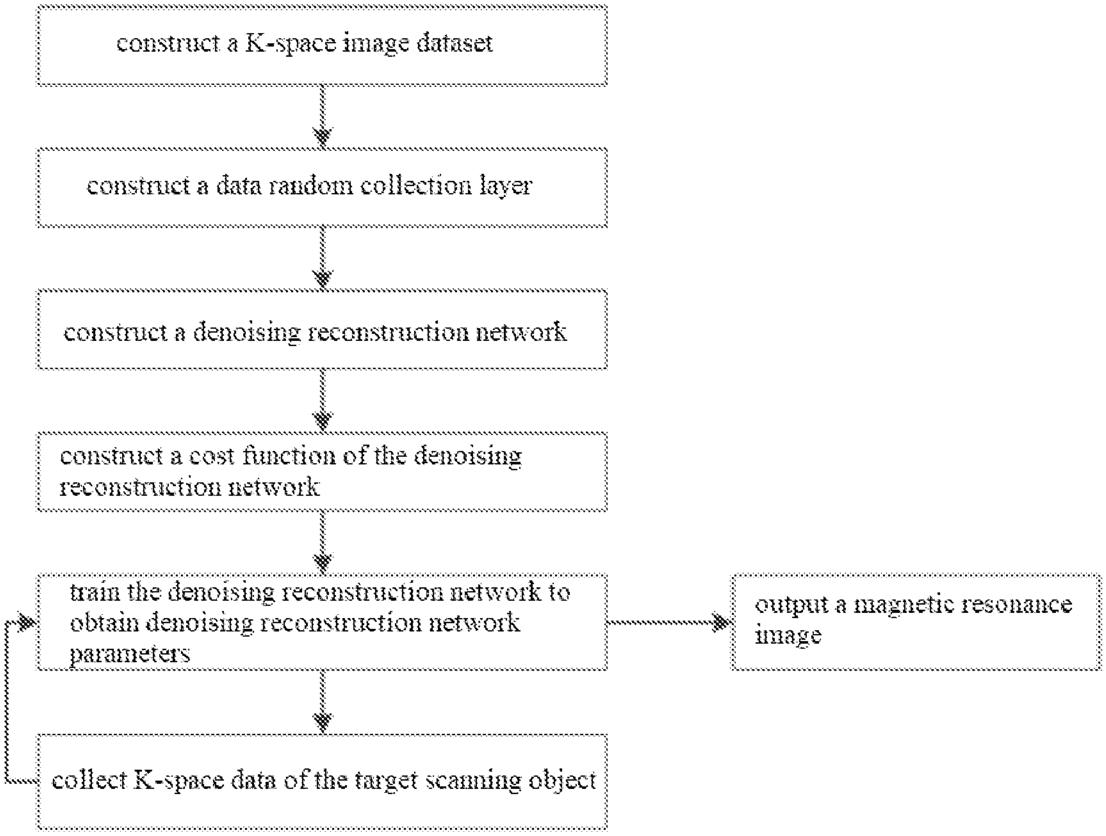
FIG. 3 is a schematic block diagram of an imaging process of the mobile magnetic resonance apparatus provided by an embodiment of the present application.

For example, as shown in FIG. 3, which is a schematic block diagram of an imaging process of the mobile magnetic resonance apparatus provided by the present application, the fully sampled K-space data of n scanning objects is selected to construct a K-space dataset DK, where the optimal value of n is 100, but is not limited to this value; then, reconstruction will be performed based on the fully sampled K-space dataset DK to obtain an image dataset DI; finally, the K-space dataset DK is made correspond with the image dataset DI one on one based on the reconstruction relationship to construct a K-space image dataset D; a random sampling function $Rand_s$ (the best implementation of which is a pseudo-random algorithm, but is not limited to this algorithm) is used to construct a random sampling block $K_s$ of a size S to obtain a data random collection layer, where the optimal value of S is 5, but is not limited to this value; a K-space denoising reconstruction network N is constructed using existing technologies such as UNet, ResNet; a cost function of the denoising reconstruction network is constructed; the obtained K-space image dataset D is randomly divided into five equal parts, with each part separately serving as a test set and the remaining four parts serving as the training set; the modeling is repeated for five times to obtain trained K-space denoising reconstruction network $N_t$ and trained K-space denoising reconstruction network parameters $\gamma_t$; the data collection parameters of the portable mobile magnetic resonance apparatus are set as the random sampling function $Rand_s$, and then K-space data collection is performed on the target object to obtain K-space data T; the K-space data T is input into the trained K-space denoising reconstruction network $N_t$ to obtain the magnetic resonance image I in combination with the trained K-space denoising reconstruction network parameters $\gamma_t$.

In the embodiments of the present application, the imaging device using the mobile magnetic resonance apparatus first randomly samples the object-to-be-scanned through the mobile magnetic resonance apparatus to acquire the encoding of the frequency and phase of the tissue of the object-to-be-scanned, and obtain the target K-space data. Then, the target K-space data and the pre-generated denoising reconstruction network parameters are input into the pre-trained denoising reconstruction network; the pre-trained denoising reconstruction network is generated by training based on fully sampled training data, and finally the magnetic resonance image corresponding to the object-to-be-scanned is output. The fully sampled training data is constructed by increasing the scanning time in the present application, the pre-trained denoising reconstruction network is obtained through model training based on the training data, real-time data is obtained through random sampling in a short period of time in practical applications, and high-quality images are output in combination with the pre-trained denoising reconstruction network; therefore, the mobile magnetic resonance apparatus can generate the magnetic resonance images in a short period of time, and the speed of generating high-quality magnetic resonance images is increased.

The following is a device embodiment of the present disclosure, which can be used to carry out the method embodiment of the present disclosure. For details not disclosed in the device embodiment of the present disclosure, reference may be made to the method embodiment of the present disclosure.

Figure 4:
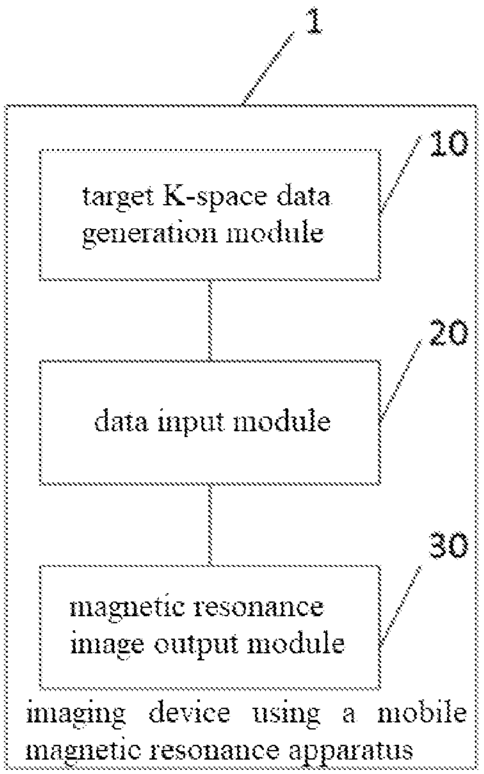
FIG. 4 is a schematic diagram of the structure of an imaging device using a mobile magnetic resonance apparatus provided by an embodiment of the present application.

Reference is made to FIG. 4, which is a schematic diagram of the structure of an imaging device using a mobile magnetic resonance apparatus provided by an illustrative embodiment of the present disclosure. The imaging device using the mobile magnetic resonance apparatus can be realized as the entirety or part of a terminal through software, hardware, or a combination of both software and hardware. The device 1 includes a target K-space data generation module 10, a data input module 20, and a magnetic resonance image output module 30.

the target K-space data generation module 10 is configured to randomly sample an object-to-be-scanned using a mobile magnetic resonance apparatus to acquire encoding of the frequency and phase of the tissue of the object-to-be-scanned, and obtain target K-space data;

the data input module 20 is configured to input the target K-space data and pre-generated denoising reconstruction network parameters into a pre-trained denoising reconstruction network; where the pre-trained denoising reconstruction network is generated based on fully sampled training data;

the magnetic resonance image output module 30 is configured to output a magnetic resonance image corresponding to the object-to-be-scanned.

It should be noted that the imaging device using the mobile magnetic resonance apparatus provided by the above embodiment is only described exemplarily with the division of the above various functional modules when executing the imaging method using the mobile magnetic resonance apparatus. In practical applications, the above functions can be assigned to different functional modules as needed, that is, the internal structure of the device can be divided into different functional modules to complete all or part of the functions described above. In addition, the imaging device using the mobile magnetic resonance apparatus provided by the above embodiment belongs to the same concept as the embodiment of the imaging method using the mobile magnetic resonance apparatus. For details of the implementation process thereof, reference may be made to the method embodiment, and a repeated description will be omitted herein.

The numbering of the above embodiments is only for descriptive purpose, and do not represent the advantages or disadvantages of the embodiments.

In the embodiments of the present application, the imaging device using the mobile magnetic resonance apparatus first randomly samples the object-to-be-scanned through the mobile magnetic resonance apparatus to acquire the encoding of the frequency and phase of the tissue of the object-to-be-scanned, and obtain the target K-space data. Then, the target K-space data and the pre-generated denoising reconstruction network parameters are input into the pre-trained denoising reconstruction network; the pre-trained denoising reconstruction network is generated by training based on fully sampled training data, and finally the magnetic resonance image corresponding to the object-to-be-scanned is output. The fully sampled training data is constructed by increasing the scanning time in the present application, the pre-trained denoising reconstruction network is obtained through model training based on the training data, real-time data is obtained through random sampling in a short period of time in practical applications, and high-quality images are output in combination with the pre-trained denoising reconstruction network; therefore, the mobile magnetic resonance apparatus can generate the magnetic resonance images in a short period of time, and the speed of generating high-quality magnetic resonance images is increased.

The present disclosure also provides a computer-readable medium on which program instructions are stored. When the program instructions are executed by a processor, the imaging method using the mobile magnetic resonance apparatus provided by the above method embodiments is implemented.

The present disclosure also provides a computer program product containing instructions; when the instructions are running on a computer, the computer executes the imaging method using the mobile magnetic resonance apparatus provided by the above method embodiments.

Figure 5:
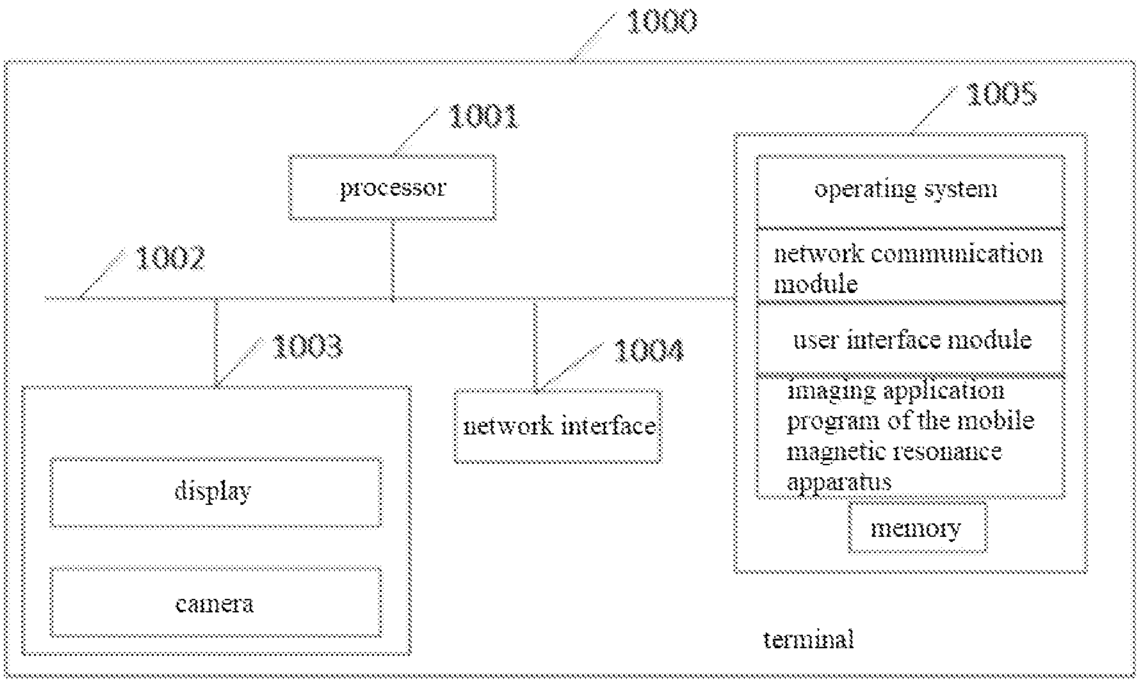
FIG. 5 is a schematic diagram of the structure of a terminal provided by an embodiment of the present application.

Reference is made to FIG. 5, which is a schematic diagram of the structure of a terminal provided by an embodiment of the present application. As shown in FIG. 5, the terminal 1000 may include: at least one processor 1001, at least one network interface 1004, a user interface 1003, a memory 1005, and at least one communication bus 1002.

The communication bus 1002 is configured to achieve connection communication between these assemblies.

The user interface 1003 may include a display and a camera; optionally, the user interface 1003 may also include standard wired interfaces and wireless interfaces.

Optionally, the network interface 1004 may include standard wired interfaces and wireless interfaces (such as WI-FI interfaces).

The processor 1001 may include one or more processing cores. The processor 1001 connects various parts of the entire electronic device 1000 through various interfaces and lines, executes various functions of the electronic device 1000 and processes data by running or executing instructions, programs, code sets or instruction sets stored in the memory 1005 and calling data stored in the memory 1005. Optionally, the processor 1001 can be implemented in at least one hardware form of Digital Signal Processing (DSP), Field-Programmable Gate Array (FPGA) and Programmable Logic Array (PLA). The processor 1001 may have a combination of one or more of Central Processing Unit (CPU), Graphics Processing Unit (GPU) and modem integrated therein. The CPU mainly handles the operating system, user interfaces, and application programs, etc.; the GPU is responsible for rendering and drawing the content that needs to be displayed on the display; and the modem is configured to handle wireless communication. It can be understood that the above-mentioned modem can also be implemented separately through a single chip without being integrated into the processor 1001.

The memory 1005 may include a Random Access Memory (RAM) or a Read-Only Memory. Optionally, the memory 1005 includes a non-transitory computer-readable storage medium. The memory 1005 can be used to store instructions, programs, codes, code sets, or instruction sets. The memory 1005 may include a storage program area and a storage data area, where the storage program area may store instructions for implementing the operating system, instructions for at least one function (such as touch function, sound playing function, image playing function, etc.), instructions for implementing the above method embodiments, etc.; the storage data area can store the data involved in the above various method embodiments. Optionally, the memory 1005 can also be at least one storage device located away from the aforementioned processor 1001. As shown in FIG. 5, the memory 1005 as a computer storage medium may include an operating system, a network communication module, a user interface module, and an imaging application program of the mobile magnetic resonance apparatus.

In the terminal 1000 shown in FIG. 5, the user interface 1003 is mainly used to provide an interface for inputting by users, so as to obtain the data input by users; and the processor 1001 can be used to call the imaging application program of the mobile magnetic resonance apparatus stored in the memory 1005, and specifically perform the following operations:

randomly sampling an object-to-be-scanned using a mobile magnetic resonance apparatus to acquire encoding of the frequency and phase of the tissue of the object-to-be-scanned, and obtain target K-space data;

inputting the target K-space data and pre-generated denoising reconstruction network parameters into a pre-trained denoising reconstruction network; where the pre-trained denoising reconstruction network is generated by training based on fully sampled training data; and outputting a magnetic resonance image corresponding to the object-to-be-scanned.

In an embodiment, the processor 1001 further performs the following operations:

using the mobile magnetic resonance apparatus to perform full sampling on multiple scanning objects to acquire the encoding of the frequency and phase of the tissue of each scanning object, and obtain multiple pieces of K-space training data;

constructing fully sampled training data based on the multiple pieces of K-space training data;

constructing a target denoising reconstruction network, inputting the fully sampled training data into the target denoising reconstruction network, and outputting a network cost value; and generating a pre-trained denoising reconstruction network and pre-generated denoising reconstruction network parameters when the network cost value reaches its minimum.

In an embodiment, the processor 1001 specifically performs the following operations when constructing the fully sampled training data based on the multiple pieces of K-space training data:

performing image reconstruction based on each K-space data to obtain the magnetic resonance image of each K-space data;

associating each K-space data with its corresponding magnetic resonance image to obtain a K-space image dataset; and randomly dividing the K-space image dataset into equal parts, and determining a preset number of parts of the K-space image dataset as the fully sampled training data.

Reference can be made to FIG. 2, which is based on the same concept as the above-mentioned embodiments and illustrates a flowchart illustrating another wake-up processing method according to an embodiment of the present disclosure. As illustrated in FIG. 2, the method can include following steps.

In an embodiment, the processor 1001 specifically performs the following operations when constructing the target denoising reconstruction network:

constructing a denoising reconstruction network using neural networks;

constructing a cost function of the denoising reconstruction network; and mapping the cost function to the denoising reconstruction network to obtain the target denoising reconstruction network;

where the cost function is:

$$F(x) = \min_{x,D,\{\gamma_i\}} \sum_i \left((\|R_i x - D\gamma_i\|) + \alpha\|Y - FFTx\|_2^2 + \beta\|R_i x - FFTx\|_2^2;\right.$$

where $R_i$, is a feature coefficient vector, x is a feature vector, D is the fully sampled training data, $\gamma_i$ is the parameter of the denoising reconstruction network, FFT is the discrete Fourier transform, Y is a true value of the reconstructed image, and α and β are constants.

In an embodiment, the processor 1001 specifically performs the following operations when generating the pre-trained denoising reconstruction network and pre-generated denoising reconstruction network parameters when the network cost value reaches its minimum:

when the network cost value does not reach its minimum, backpropagating the network cost value to update the network parameters of the denoising reconstruction network, and continuing the execution of the step of "inputting the fully sampled training data into the target denoising reconstruction network and outputting a network cost value" until the network cost value reaches its minimum and the number of network training reaches a preset number to generate the pre-trained denoising reconstruction network and pre-generated denoising reconstruction network parameters.

In the embodiments of the present application, the imaging device using the mobile magnetic resonance apparatus first randomly samples the object-to-be-scanned through the mobile magnetic resonance apparatus to acquire the encoding of the frequency and phase of the tissue of the object-to-be-scanned, and obtain the target K-space data. Then, the target K-space data and the pre-generated denoising reconstruction network parameters are input into the pre-trained denoising reconstruction network; the pre-trained denoising reconstruction network is generated by training based on fully sampled training data, and finally the magnetic resonance image corresponding to the object-to-be-scanned is output. The fully sampled training data is constructed by increasing the scanning time in the present application, the pre-trained denoising reconstruction network is obtained through model training based on the training data, real-time data is obtained through random sampling in a short period of time in practical applications, and high-quality images are output in combination with the pre-trained denoising reconstruction network; therefore, the mobile magnetic resonance apparatus can generate the magnetic resonance images in a short period of time, and the speed of generating high-quality magnetic resonance images is increased.

It can be understood by those skilled in the art that the implementation of all or part of the processes in the above method embodiments can be completed by instructing relevant hardware through computer programs. The imaging program of the mobile magnetic resonance apparatus can be stored in a computer-readable storage medium, and the program may include processes of the above method embodiments when executed. The storage medium for the imaging program of the mobile magnetic resonance apparatus can be a magnetic disk, an optical disc, a read-only storage memory, or a random storage memory, etc.

Described above are only preferred embodiments of the present application, and of course, they cannot be used to limit the scope of claims of the present application. Therefore, equivalent changes made according to the claims of the present application still fall within the scope covered by the present application.

What is claimed is:

1. An imaging method using a mobile magnetic resonance apparatus, comprising:

randomly sampling an object-to-be-scanned using a mobile magnetic resonance apparatus to acquire encoding of the frequency and phase of the tissue of the object-to-be-scanned, and obtain target K-space data;

inputting the target K-space data and pre-generated denoising reconstruction network parameters into a pre-trained denoising reconstruction network; wherein the pre-trained denoising reconstruction network is generated by training based on fully sampled training data; and outputting a magnetic resonance image corresponding to the object-to-be-scanned, wherein the pre-trained denoising reconstruction network is generated according to the following steps, which comprise:

using the mobile magnetic resonance apparatus to perform full sampling on multiple scanning objects to acquire the encoding of the frequency and phase of the tissue of each scanning object, and obtain multiple pieces of K-space training data;

constructing fully sampled training data based on the multiple pieces of K-space training data;

constructing a target denoising reconstruction network, inputting the fully sampled training data into the target denoising reconstruction network, and outputting a network cost value; and generating a pre-trained denoising reconstruction network and pre-generated denoising reconstruction network parameters when the network cost value reaches its minimum, wherein the constructing fully sampled training data based on the multiple pieces of K-space training data comprises:

performing image reconstruction based on each K-space data to obtain the magnetic resonance image of each K-space data;

associating each K-space data with its corresponding magnetic resonance image to obtain a K-space image dataset; and randomly dividing the K-space image dataset into equal parts, and determining a preset number of parts of the K-space image dataset as the fully sampled training data.

2. The method according to claim 1, wherein the constructing a target denoising reconstruction network comprises:

constructing a denoising reconstruction network using neural networks;

constructing a cost function of the denoising reconstruction network; and mapping the cost function to the denoising reconstruction network to obtain a target denoising reconstruction network;

wherein the cost function is:

$$F(x) = \min_{x,D,\{\gamma_i\}} \sum_i \left((\|R_i x - D\gamma_i\|) + \alpha\|Y - FFTx\|_2^2 + \beta\|R_i x - FFTx\|_2^2\right);$$

where Ri is a feature coefficient vector, x is a feature vector, D is the fully sampled training data, $\gamma_i$ is the parameter of the denoising reconstruction network, FFT is the discrete Fourier transform, Y is a true value of the reconstructed image, and α and β are constants.

3. The method according to claim 1, wherein before the randomly sampling an object-to-be-scanned using a mobile magnetic resonance apparatus, the method further comprises:

using a random sampling function to construct a random sampling block of a preset size to obtain a data random collection layer; and setting data collection parameters of the mobile magnetic resonance apparatus as the data random collection layer.

4. The method according to claim 3, wherein the function of the random sampling block is:

$$K_S(i, j) = \begin{cases} Rand_S(i, j) \geq 0.5 \\ Rand_S(i, j) < 0.5 \end{cases}, 0 \leq i \leq S, 0 \leq j \leq S;$$

where $K_s$ is the random sampling block, i, j are element coordinates of the random sampling block, S is the size of the random sampling block, and $Rand_s$ is the random sampling function.

5. The method according to claim 1, wherein the generating a pre-trained denoising reconstruction network and pre-generated denoising reconstruction network parameters when the network cost value reaches its minimum comprises:

when the network cost value does not reach its minimum, backpropagating the network cost value to update the network parameters of the denoising reconstruction network, and continuing the execution of the step of "inputting the fully sampled training data into the target denoising reconstruction network and outputting a network cost value" until the network cost value reaches its minimum and the number of network training reaches a preset number to generate the pre-trained denoising reconstruction network and pre-generated denoising reconstruction network parameters.

6. An imaging device using a mobile magnetic resonance apparatus, comprising:

a target K-space data generation module, which is configured to randomly sample an object-to-be-scanned using a mobile magnetic resonance apparatus to acquire encoding of the frequency and phase of the tissue of the object-to-be-scanned, and obtain target K-space data;

a data input module, which is configured to input the target K-space data and pre-generated denoising reconstruction network parameters into a pre-trained denoising reconstruction network; wherein the pre-trained denoising reconstruction network is generated based on fully sampled training data; and a magnetic resonance image output module, which is configured to output a magnetic resonance image corresponding to the object-to-be-scanned, wherein the pre-trained denoising reconstruction network is generated according to the following steps, which comprise:

using the mobile magnetic resonance apparatus to perform full sampling on multiple scanning objects to acquire the encoding of the frequency and phase of the tissue of each scanning object, and obtain multiple pieces of K-space training data;

constructing fully sampled training data based on the multiple pieces of K-space training data;

constructing a target denoising reconstruction network, inputting the fully sampled training data into the target denoising reconstruction network, and outputting a network cost value; and generating a pre-trained denoising reconstruction network and pre-generated denoising reconstruction network parameters when the network cost value reaches its minimum;

wherein the constructing fully sampled training data based on the multiple pieces of K- space training data comprises:

performing image reconstruction based on each K-space data to obtain the magnetic resonance image of each K-space data;

associating each K-space data with its corresponding magnetic resonance image to obtain a K-space image dataset; and randomly dividing the K-space image dataset into equal parts, and determining a preset number of parts of the K-space image dataset as the fully sampled training data.

7. A computer-readable storage medium, storing multiple instructions suitable for being loaded by a processor to execute the method according to claim 1, wherein the storage medium includes: a magnetic disk, an optical disc, or a read-only storage memory.

8. A terminal comprising a processor and a memory; wherein computer programs are stored in the memory, and the computer programs are suitable for being loaded by the processor to execute the method according to claim 1.

* * * * *